(12) United States Patent
Kawakami et al.

(10) Patent No.: US 9,246,506 B2
(45) Date of Patent: Jan. 26, 2016

(54) SEMICONDUCTOR INTEGRATED CIRCUIT DEVICE AND DATA PROCESSING SYSTEM

(71) Applicant: Renesas Electronics Corporation, Kawasaki-shi, Kanagawa (JP)

(72) Inventors: Fumiki Kawakami, Kanagawa (JP); Naoki Yada, Kanagawa (JP); Hiroyuki Tsunakawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/628,101

(22) Filed: Feb. 20, 2015

(65) Prior Publication Data

US 2015/0162927 A1 Jun. 11, 2015

Related U.S. Application Data

(63) Continuation of application No. 13/762,229, filed on Feb. 7, 2013, now Pat. No. 8,970,410.

(30) Foreign Application Priority Data

Feb. 8, 2012 (JP) .................................. 2012-024786
Oct. 31, 2012 (JP) .................................. 2012-240110

(51) Int. Cl.
*H03M 1/00* (2006.01)
*H03M 1/12* (2006.01)

(52) U.S. Cl.
CPC ................ *H03M 1/122* (2013.01); *H03M 1/12* (2013.01); *H03M 1/1205* (2013.01); *H03M 1/1225* (2013.01)

(58) Field of Classification Search
CPC ....... H03M 1/00; H03M 1/1225; H03M 1/12; H03M 1/1205; H03M 2201/17; H03M 2201/41

USPC .................................................. 341/141, 155
See application file for complete search history.

(56) References Cited

U.S. PATENT DOCUMENTS 5,172,116 A 12/1992 Noma
5,916,296 A * 6/1999 Honda .......................... 701/115

(Continued)

FOREIGN PATENT DOCUMENTS

JP 5-314281 A 11/1993
JP 8-272765 A 10/1996

(Continued)

OTHER PUBLICATIONS

Extended European Search Report issued Mar. 25, 2014, in European Patent Application No. 13154177.3.

*Primary Examiner* — Jean B Jeanglaude
(74) *Attorney, Agent, or Firm* — Shapiro, Gabor and Rosenberger, PLLC

(57) ABSTRACT

The semiconductor integrated circuit device has: more than one analog port; an A/D conversion part operable to execute an A/D conversion process for converting an analog signal taken in through each analog port into a digital signal for each preset virtual channel; and an A/D conversion control part operable to control an action of the A/D conversion part. The A/D conversion control part includes: virtual channel registers on which correspondence between the virtual channel and the analog port can be set; and a scan-group-forming register on which a start position of a scan group and an end position thereof can be set. The A/D conversion control part controls the A/D conversion part to successively execute an A/D conversion process on a plurality of virtual channels from a virtual channel associated with the start pointer to a virtual channel associated with the end pointer.

14 Claims, 9 Drawing Sheets

(56) References Cited

U.S. PATENT DOCUMENTS

| | | | |
|---|---|---|---|
| 6,356,216 B1 | 3/2002 | Chen et al. | |
| 6,481,201 B2 * | 11/2002 | Kako et al. | 60/285 |
| 6,486,809 B1 | 11/2002 | Figoli | |
| 7,009,537 B2 | 3/2006 | Kabune | |
| 7,126,522 B2 * | 10/2006 | Ogawa | 341/155 |
| 7,400,283 B1 | 7/2008 | Zhu | |
| 7,474,240 B2 | 1/2009 | Barrenscheen | |
| 7,962,274 B2 * | 6/2011 | Yonezawa et al. | 701/103 |
| 2003/0120724 A1 | 6/2003 | Kawashimo et al. | |
| 2004/0267986 A1 | 12/2004 | Leung et al. | |
| 2005/0040978 A1 | 2/2005 | Morita et al. | |
| 2005/0219103 A1 | 10/2005 | Ogawa | |
| 2005/0231413 A1 * | 10/2005 | Ogawa | 341/155 |
| 2008/0252243 A1 | 10/2008 | Azuma | |
| 2008/0283025 A1 * | 11/2008 | Sato | 123/406.45 |
| 2009/0058702 A1 | 3/2009 | Sugihara et al. | |
| 2009/0278717 A1 | 11/2009 | Yang et al. | |
| 2011/0102221 A1 | 5/2011 | Guido et al. | |

FOREIGN PATENT DOCUMENTS

| | | |
|---|---|---|
| JP | 2005-303575 A | 10/2005 |
| JP | 2007-208738 A | 8/2007 |
| JP | 2009-60186 A | 3/2009 |

* cited by examiner

SEMICONDUCTOR INTEGRATED CIRCUIT DEVICE AND DATA PROCESSING SYSTEM

CROSS-REFERENCE TO RELATED APPLICATIONS

The Present application claims priority from Japanese applications JP 2012-240110 filed on Oct. 31, 2012 and JP 2012-024786 filed on Feb. 8, 2012, the content of which is hereby incorporated by reference into this application.

BACKGROUND

The present invention relates to a semiconductor technology, and particularly relates to a semiconductor integrated circuit device having an A/D function for converting an analog signal into a digital signal, and a data processing system using the same.

JP-A-5-314281 discloses a microcomputer which has only one A/D converter built therein for a plurality of analog input terminals, and which is arranged so as to perform A/D conversion in a time-sharing method by switching the plurality of analog input terminals.

JP-A-8-272765 describes a technique for reducing a load on CPU, which is produced by the setting or change of a condition of A/D conversion in a microcomputer with a built-in A/D converter.

JP-A-2009-60186 discloses an A/D conversion device which can detect a motor current in an A/D conversion time for two phases out of three phases of a sinusoidal wave-driven motor by reducing register resources while the number of A/D converters is minimized.

JP-A-2007-208738 describes an A/D conversion device arranged so that the order of A/D conversions can be set by a software program adequately in a scan mode.

JP-A-2005-303575 describes a technique for successively executing A/D conversion on a plurality of analog input channels through which a plurality of analog signals are supplied.

SUMMARY

A microcontrol unit for automobile engine control may be taken as an example of semiconductor integrated circuit devices. A microcontrol unit for automobile engine control has been required to convert pieces of analog information from many sensors at a higher speed with update of the generation. However, it is difficult to increase the number of analog-conversion terminals of a microcontrol unit for automobile engine control corresponding to an increasing number of sensors. On this account, the following are required: to provide a multiplexer for selectively taking pieces of analog information from many sensors into a microcontrol unit for automobile engine control outside the microcontrol unit; and to control its terminals as conversion terminals of the microcontrol unit.

However, according to the related art, a flag is set on a select register (physical register) of a terminal, on which the execution of the conversion is desired, and conversions of flagged conversion-target terminals are executed in ascending order of register terminal numbers. Therefore, the order of the conversions is restricted so that the conversions are executed in ascending order of terminal numbers, and the A/D conversions on analog signals input from the outside cannot be performed in an arbitrary order.

Other objects and novel features will be apparent from the description hereof and the accompanying drawings.

One preferred embodiment of means for solving the problems will be outlined below briefly.

An semiconductor integrated circuit device in connection with the preferred embodiment has: more than one analog port; an A/D conversion part operable to execute an A/D conversion process for converting analog signals taken in through the analog ports into digital signals for each preset virtual channel; and an A/D conversion control part operable to control the action of the A/D conversion part. The A/D conversion control part includes: virtual channel registers on which correspondence between the virtual channel and the analog port can be set; and a scan-group-forming register on which a start pointer showing a start position of a scan group, and an end pointer showing an end position of the scan group can be set. The A/D conversion control part controls the A/D conversion part to successively execute the A/D conversion process on a plurality of virtual channels from a virtual channel associated with the start pointer to a virtual channel associated with the end pointer.

The effect that the one preferred embodiment of means for solving the problems brings about is briefly as follows.

It is possible to provide a semiconductor integrated circuit device capable of performing A/D conversion of a plurality of analog signals input from the outside in an arbitrary order, and a data processing system with the semiconductor integrated circuit device.

DETAILED DESCRIPTION

1. Summary of the Embodiments

Figure 1:
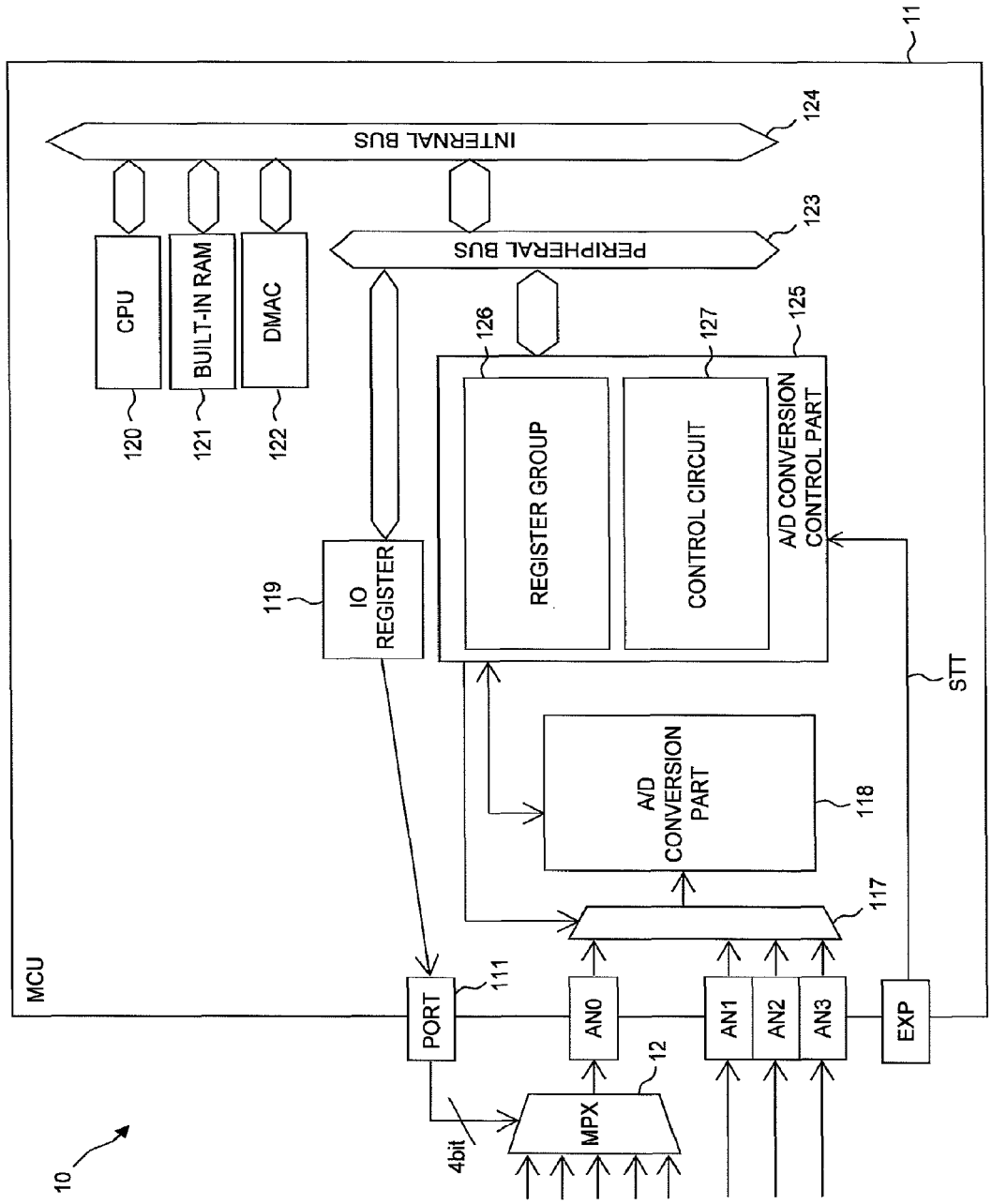
FIG. 1 is a block diagram showing an example of the structure of the data processing system.

The preferred embodiments herein disclosed will be outlined first. Here, the reference numerals or characters for reference to the drawings, which are accompanied with paired round brackets, only exemplify what the concepts of members or parts referred to by the numerals or characters contain.

[1] A semiconductor integrated circuit device (11) according to one preferred embodiment of the invention includes: more than one analog port (AN0-AN3); an A/D conversion part (118) operable to execute an A/D conversion process for converting analog signals taken in through the analog ports into digital signals for each preset virtual channel; and an A/D conversion control part (125) which controls an action of the A/D conversion part. The A/D conversion control part includes: virtual channel registers (SVCR0-SVCR47) on which correspondence between the virtual channel and the analog port can be set; and a scan-group-forming register (206) on which a start pointer showing a start position of a scan group, and an end pointer showing an end position of the scan group can be set. The A/D conversion control part controls the A/D conversion part to successively execute the A/D conversion process on a plurality of virtual channels from a virtual channel associated with the start pointer to a virtual channel associated with the end pointer.

In the arrangement described above, correspondences between the virtual channels and the analog ports are set on the virtual channel registers; the start position of a scan group is set for the start pointer, and the end position of the scan group is set for the end pointer. In this way, it becomes possible to make the A/D conversion part execute the A/D conversion process on a plurality of virtual channels from a virtual channel associated with the start pointer to a virtual channel associated with the end pointer successively. The correspondences between the virtual channels and the analog ports can be set appropriately. Therefore, the settings described above allows A/D conversion of a plurality of analog signals taken in through the analog ports in an arbitrary order.

[2] In the semiconductor integrated circuit device described in [1], more than one scan group (SG0-SGn) can be formed by setting more than one pair of the start pointer and the end pointer corresponding thereto on the scan-group-forming register.

[3] In the semiconductor integrated circuit device described in [2], the scan-group-forming register may include a multicycle register (2066) on which a number of repetition of the A/D conversion process can be set for each scan group. The A/D conversion process can be repeated an appropriate number of times by the setting on the multicycle register.

[4] In the semiconductor integrated circuit device described in [3], the scan-group-forming register may include a control register (2061) on which a priority of A/D conversion can be set for each scan group. Setting a priority setting on the control register, the A/D conversion process can be performed efficiently according to the priority.

[5] A data processing system (10) according to an preferred embodiment of the invention includes: a multiplexer (12) operable to select a plurality of analog signals; and the semiconductor integrated circuit device (11) operable to process an analog signal selected by the multiplexer. The semiconductor integrated circuit device includes: more than one analog port (AN0-AN3); the A/D conversion part (118) operable to execute an A/D conversion process for converting an analog signal taken in through each analog port into a digital signal for each preset virtual channel; and the A/D conversion control part (125) operable to control an action of the A/D conversion part. The A/D conversion control part includes: the virtual channel registers (SVCR0-SVCR47) on which correspondence between the virtual channel and the analog port can be set; and the scan-group-forming register (206) on which a start pointer showing a start position of a scan group, and an end pointer showing an end position of the scan group can be set. The A/D conversion control part controls the A/D conversion part to successively execute the A/D conversion process on a plurality of virtual channels from a virtual channel associated with the start pointer to a virtual channel associated with the end pointer.

In the arrangement described above, correspondences between the virtual channels and the analog ports are set on the virtual channel registers; the start position of a scan group is set for the start pointer, and the end position of the scan group is set for the end pointer. In this way, it becomes possible to make the A/D conversion part successively execute the A/D conversion process on a plurality of virtual channels from a virtual channel associated with the start pointer to a virtual channel associated with the end pointer. Therefore, correspondences between the virtual channels and the analog ports can be set arbitrarily as in the case of [1] described above. Therefore, the settings described above allows A/D conversion of a plurality of analog signals taken in through the analog ports in an arbitrary order.

[6] In the data processing system described in [5], a plurality of scan groups (SG0-SGn) can be formed by setting more than one pair of the start pointer and the end pointer corresponding to the start pointer on the scan-group-forming register.

[7] In the data processing system described in [6], the scan-group-forming register may include the multicycle register (2066) on which a number of repetition of the A/D conversion process can be set for each scan group. By the setting on the multicycle register, the A/D conversion process can be repeated an appropriate number of times.

[8] In the data processing system described in [7], the scan-group-forming register may include the control register (2061) on which a priority of A/D conversion can be set for each scan group. By the priority setting on the control register, the A/D conversion process can be performed efficiently according to the priority.

[9] In the data processing system described in [8], the virtual channel register may include: a conversion channel information storage area (301) on which correspondence between the virtual channel and the analog port can be set; and an enable signal setting area (302) on which an enable signal showing the effectiveness of the multiplexer can be set. In addition, the virtual channel register may have a multiplexer channel information storage area (303) on which information for designating a select channel in the multiplexer can be set; and a weight information storage area (304) on which weight information for delaying the start timing of the A/D conversion process for each virtual channel can be set.

[10] In the data processing system described in [9], the A/D conversion control part may be arranged to set the information set in the multiplexer channel information storage area to the multiplexer in the case of making the virtual channel with the enable signal in an enable state an analog port for the multiplexer. At this time, the A/D conversion control part may be arranged so that the A/D conversion start timing in the A/D conversion part for an analog signal taken in through the multiplexer is delayed according to the weight information. Thus, the A/D conversion part can perform the A/D conversion of an analog signal concerned in a condition that the analog signal taken in through the multiplexer is stable.

[11] The multiplexer (12) may be composed of a combination of multiplexers. The manufacturing cost can be reduced by combining general-purpose multiplexers to form a large-scale multiplexer in some cases. In such case, the multiplexer (12) may be composed of a combination of multiplexers.

[12] In the data processing system described in [11], the multiplexer may include a first multiplexer (401) and a second multiplexer (402), both operable to select analog signals. In this case, an output terminal of the first multiplexer, and an output terminal of the second multiplexer are commonly connected to the analog port (AN0) for the multiplexer; information for designating a select channel in the multiplexer is partially used to exclusively operate the first and second multiplexers.

The first and second multiplexers arranged to exclusively work in this way makes it possible to avoid that the output of the first multiplexer, and the output of the second multiplexer interfere with each other.

By commonly connecting the output terminal of the first multiplexer and the output terminal of the second multiplexer to the analog port (AN0) for the multiplexer, the first and second multiplexers are allowed to share the analog port (AN0). In this respect, the number of analog ports can be reduced in comparison to the case of coupling the first and second multiplexers with analog ports for the exclusive use respectively.

2. Further Detailed Description of the Embodiments

The embodiments will be described further in detail.

First Embodiment

FIG. 1 shows an example of the structure of the data processing system.

The data processing system 10 shown in FIG. 1 has: the microcontrol unit (MCU) 11 which is an example of the semiconductor integrated circuit device; and the external multiplexer (MPX) 12 placed on a board for mounting parts, provided that the external multiplexer is connected to the microcontrol unit 11 from the outside. The external multiplexer 12 has the function of selectively outputting analog signals input to itself. The microcontrol unit 11 takes in and processes an analog signal selected by the external multiplexer 12. Although no special restriction is intended, the microcontrol unit 11 is formed on a semiconductor substrate such as a monocrystalline silicon substrate by a well-known semiconductor integrated circuit manufacturing technology.

Although no special restriction is intended, the microcontrol unit 11 includes: a digital port 111; the analog ports AN0, AN1, AN2, and AN3; and a start-trigger-external-input port EXP. Although no special restriction is intended, the digital port 111 has a 4-bit structure, and serves as a dedicated port for transmitting a digital signal for setting a select channel to the external multiplexer 12. The analog port AN0 is used as a dedicated port for taking an analog signal output by the external multiplexer 12 into the microcontrol unit 11. The analog ports AN1 to AN3 are used as dedicated ports for taking, into the microcontrol unit 11, analog signals which are not routed through the external multiplexer 12. The start-trigger-external-input port EXP is used as a dedicated port for taking a start trigger signal STT into the microcontrol unit 11 from the outside thereof.

Although no special restriction is intended, the microcontrol unit 11 includes: a built-in multiplexer 117; the A/D conversion part 118; an IO (Input/Output) register 119; a CPU (Central Processing Unit) 120; a built-in RAM (Random Access Memory) 121; a DMAC (Direct Memory Access Controller) 122; and the A/D conversion control part 125. The CPU 120, the built-in RAM 121 and the DMAC 122 are coupled to each other so that they can mutually exchange signals through an internal bus 124. The internal bus 124 is connected with a peripheral bus 123. To the peripheral bus 123, the IO register 119 and the A/D conversion control part 125 are connected.

The IO register 119 is used to store data to be output through the digital port 111 to the outside. The CPU 120 performs action control of the whole MCU 11 according to a preset program. The built-in RAM 121 is used for a working area or the like in a computing process in the CPU 120. The DMAC 122 controls data transfer which is directly performed, and which the CPU 120 is not involved in. The built-in multiplexer 117 selects and outputs analog signals taken in through the analog ports AN0 to AN3 respectively. The A/D conversion part 118 converts an analog signal selected by the built-in multiplexer 117 into a digital signal. The A/D conversion control part 125 controls the selecting action of the built-in multiplexer 117, and the A/D converting action of the A/D conversion part 118. Although no special restriction is intended, the A/D conversion control part 125 includes a register group 126 capable of holding various information concerning the A/D converting action of the A/D conversion part 118, and a control circuit 127 which controls the action of the built-in multiplexer 117 and the action of the A/D conversion part 118 according to information held by the register group 126. Other than the A/D conversion control part 125, the CPU 120 and the DMAC 122 can access the register group 126.

Figure 2:
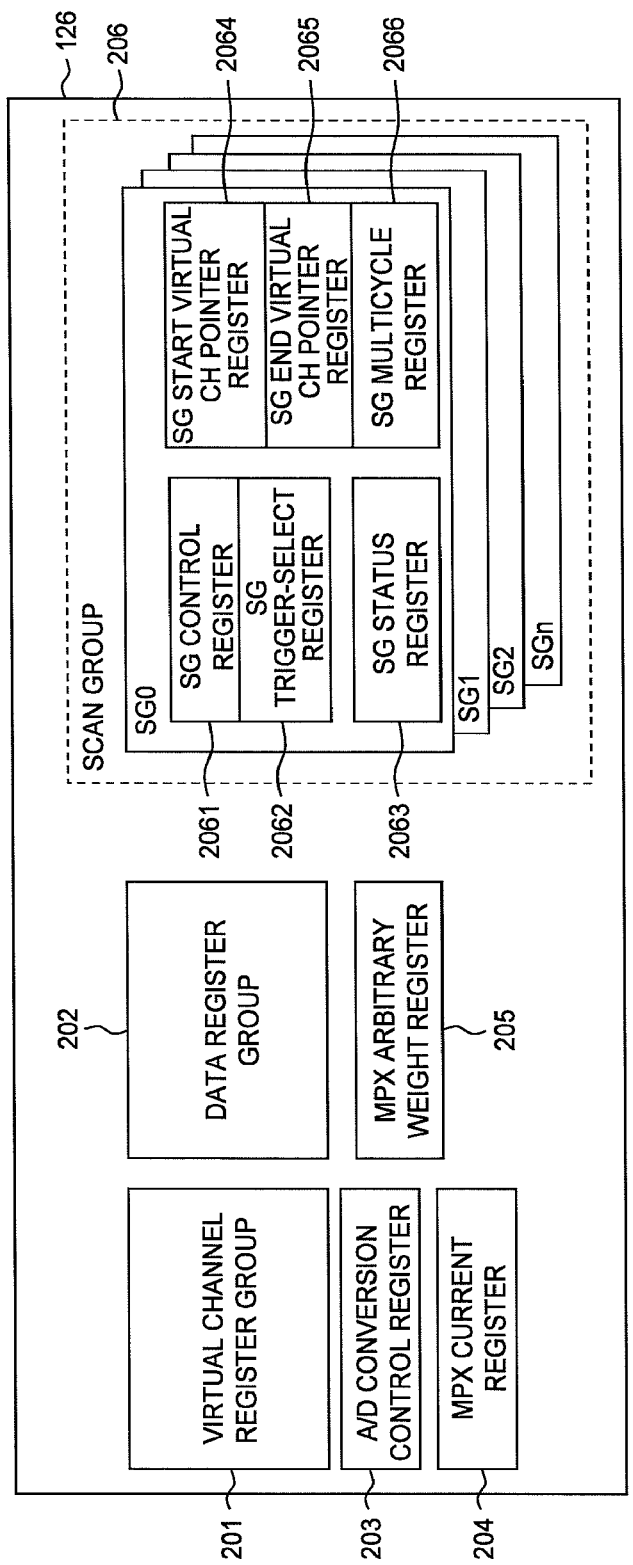
FIG. 2 is a block diagram showing an example of the structure of a register group in the data processing system shown in FIG. 1.

FIG. 2 shows an example of the structure of the register group 126.

The register group 126 includes: a virtual channel register group 201; a data register group 202; an A/D conversion control register 203; a MPX current register 204; a MPX optional wait register 205; and the scan-group-forming register 206.

Figure 3:
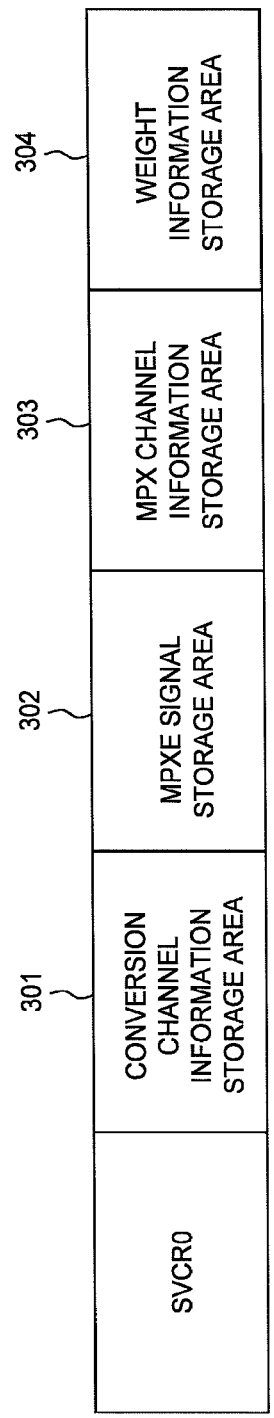
FIG. 3 is a diagram for explaining an example of the structure of a virtual channel register in the register group.

The virtual channel register group 201 includes a plurality of virtual channel registers. The virtual channel registers are provided to correspond to the virtual channels. Although no special restriction is intended, in this embodiment, the number of virtual channels is 48 and corresponding to it, the virtual channel register group 201 has 48 virtual channel registers SVCR0, SVCR1, SVCR2, . . . , SVCR47 formed therein. The numeral portion of each reference character string of the 48 virtual channel registers SVCR0, SVCR1, SVCR2, SVCR47 shows a "virtual channel number" as it is. In the A/D conversion part 118, the A/D conversion is performed in ascending order of the virtual channel number. In each virtual channel register, a plurality of information storage areas are formed. FIG. 3 shows an example of the structure of the virtual channel register SVCR0, which is one of the plurality of information storage areas. The virtual channel register SVCR0 shown in FIG. 3 includes: the conversion channel information storage area 301; the multiplexer enable (MPXE) signal storage area 302; the multiplexer (MPX) channel information storage area 303; and the weight information storage area 304. On the conversion channel information storage area 301, the correspondences between the virtual channels and the analog ports can be set. On the multiplexer enable (MPXE) signal storage area 302, an enable signal for showing the effectiveness of each virtual channel can be set. On the multiplexer (MPX) channel information storage area 303, apiece of information for designating a select channel in a select circuit can be set. On the weight information storage area 304, a piece of weight information for delaying the timing of start of the A/D conversion process can be set for each virtual channel.

The data register group 202 shown in FIG. 2 is for storing a result of A/D conversion by the A/D conversion part 118, and includes 48 data registers formed corresponding to 48 virtual channel registers (SVCR0, SVCR1, SVCR2, . . . , SVCR47) in the virtual channel register group 201 of the external multiplexer 12. In the A/D conversion control register 203, pieces of control information concerning the start and the end of an A/D converting action in the A/D conversion part 118 are stored. In the MPX current register 204, a piece of select information showing a current analog signal select state in the external multiplexer 12 is held. The MPX optional wait register 205 is arranged so that a user of the microcontrol unit 11 can write therein a piece of appropriate weight information. A piece of weight information set on the MPX optional wait register 205 is set in the weight information storage area 304 in the virtual channel register group 201.

The scan-group-forming register 206 includes a plurality of scan-group-forming registers SG0, SG1, ..., SGn corresponding to a plurality of scan groups. The scan-group-forming register SG0 includes: the SG control register 2061; an SG trigger-select register 2062; an SG status register 2063; an SG start pointer register 2064; an SG end pointer register 2065; and the SG multicycle register 2066. The SG control register 2061 stores a piece of priority information of each scan group. The SG trigger-select register 2062 stores a piece of SG trigger select information for specifying the timing of start of the A/D conversion process for each scan group. Examples of the SG trigger include: a start trigger formed by a timer; a start trigger formed in response to the execution of a program by the CPU 120; and a start trigger caused by a signal (STT) taken in through the start-trigger-external-input port EXP. Which trigger to validate depends on the setting of the SG trigger-select register 2062. That is, according to the SG trigger select information set on the SG trigger-select register 2062, the corresponding trigger fit for a scan group concerned is enabled. The SG status register 2063 stores a piece of information showing a current status of each scan group. The SG start pointer register 2064 has a piece of information concerning an A/D conversion start point (start virtual channel) for each scan group set thereon. The SG end pointer register 2065 stores a piece of information concerning an A/D conversion end point (end virtual channel) for each scan group. On the SG multicycle register 2066, the number of repetition of the A/D conversion for each scan group is set. That is, the number of repetition of the A/D conversion for each scan group is set thereon in the case that virtual channels between a virtual channel corresponding to the start point of A/D conversion, and a virtual channel corresponding to the end point of the A/D conversion go through the A/D conversion successively.

Other scan-group-forming registers SG1, ..., SGn are arranged as the scan-group-forming register SG0 is arranged, and therefore the detailed description thereof is skipped here.

Next, the effect of the above-described arrangement will be described.

The settings of the scan groups, and the action thereof will be described first.

Figure 4:
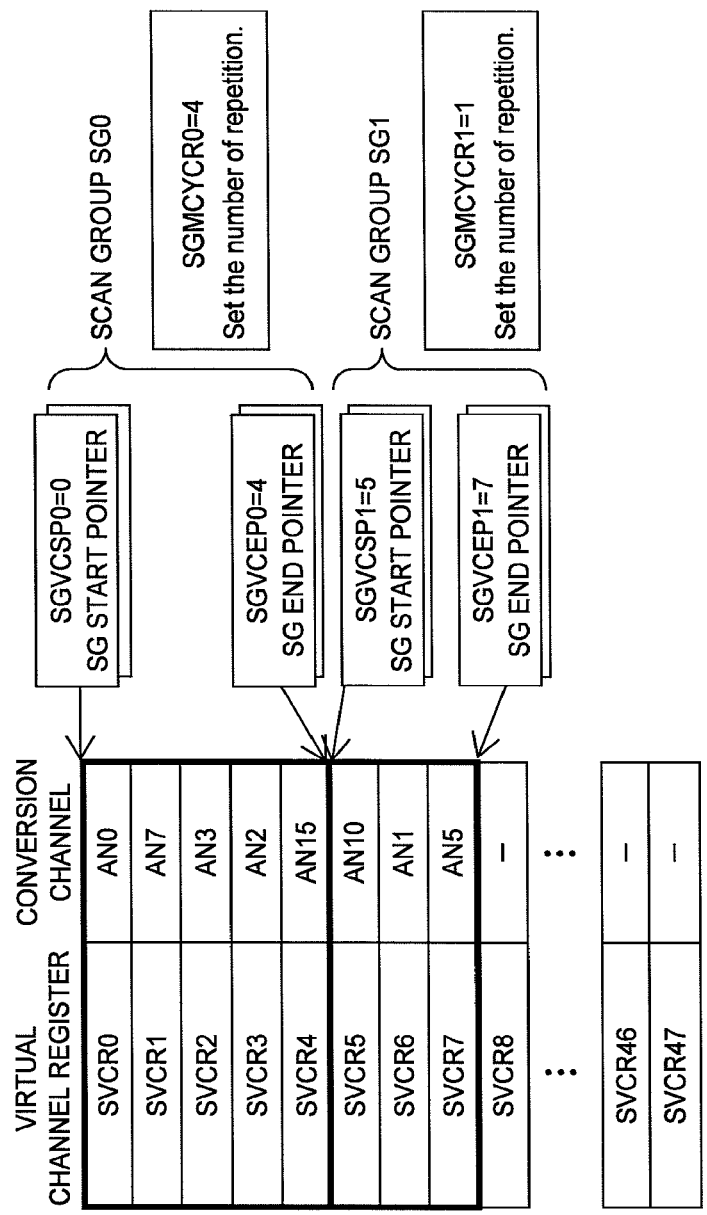
FIG. 4 is a diagram for explaining an example of the setting of a scan group.

FIG. 4 shows examples of settings of the scan groups.

In this embodiment, 48 virtual channel registers SVCR0, SVCR1, SVCR2, ..., SVCR47 are formed in the virtual channel register group 201. On the virtual channel registers SVCR0, SVCR1, SVCR2, ..., SVCR47, a conversion channel on which execution of the A/D conversion is wanted, namely an analog port assigned to the channel is set. According to the setting example shown in FIG. 4, the analog ports AN0, AN7, AN3, AN2, AN15, AN10, AN1, and AN5 correspond to the virtual channel registers SVCR0, SVCR1, SVCR2, SVCR3, SVCR4, SVCR5, SVCR6, SVCR7 respectively. According to the setting like this, the corresponding conversion channel (analog port) is selected by the built-in multiplexer 117, and is subjected to the A/D conversion in the A/D conversion part 118 for each virtual channel. In the case of actually performing the A/D conversion, the SG start pointer and the SG end pointer are set. The SG start pointer is set on the SG start pointer register 2064 for each scan group, and the SG end pointer is set on the SG end pointer register 2065 for each scan group. In the example shown by FIG. 4, SGVCSP0=0 is set for an SG start pointer, and SGVCEP0=4 is set for an SG end pointer, thereby forming a scan group SG0. Likewise, setting SGVCSP1=5 for an SG start pointer, and SGVCEP1=7 for an SG end pointer, a scan group SG1 is formed. Further, SGMCYCR0=4 is set as the number of repetition of A/D conversion on the scan group SG0, and SGMCYCR1=1 is set as the number of repetition of A/D conversion on the scan group SG1. The number of repetition of A/D conversion is set on the SG multicycle register 2066 for each scan group. According to the settings like this, the A/D conversion process associated with the analog ports AN0, AN7, AN3, AN2, and AN15 is repeated four times as an A/D conversion process on the scan group SG0 in the A/D conversion part 118. After that, as the A/D conversion process on the scan group S1, the A/D conversion process associated with the analog ports AN10, AN1, and AN5 is performed once.

While two scan groups are set in the example shown in FIG. 4, the number of scan groups which can be set can be increased. In addition, the scan group can be set to overlap with each other. For instance, with SGVCEP0=5 set as the SG end pointer of the scan group SG0, the A/D conversion process is performed on both the scan groups SG0 and SG1 in regard to the analog port AN10. Further, in the case of performing the A/D conversion process on more than one scan groups, the A/D conversion process is performed according to the set priorities as long as priority information for each scan group has been set on the SG control register 2061. The result of the A/D conversion process is stored in the data register group 202, and is used for the computing process in the CPU 120.

Next, the control of A/D conversion on analog signals taken in through the external multiplexer 12 will be described.

Figure 5:
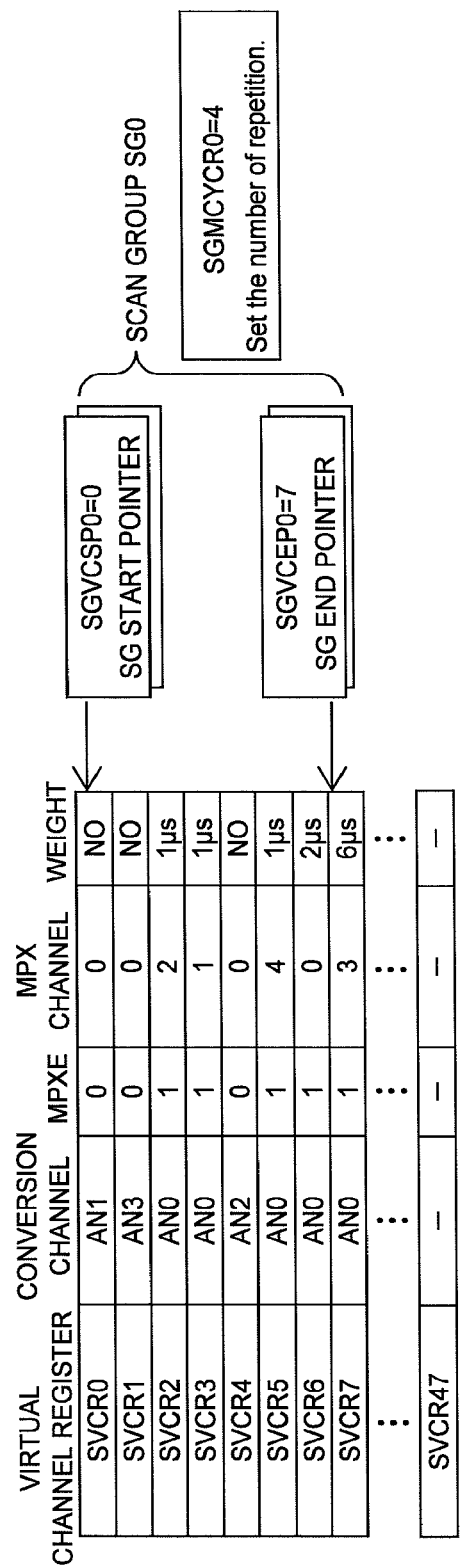
FIG. 5 is a diagram for explaining an example of the setting in the case of using a multiplexer.

FIG. 5 shows an example of the setting in the case of using the external multiplexer 12.

In the examples of settings shown in FIG. 5, the analog ports AN1, AN3, AN0, AN0, AN2, AN0, AN0, and AN0 correspond to virtual channel registers SVCR0, SVCR1, SVCR2, SVCR3, SVCR4, SVCR5, SVCR6, and SVCR7, respectively.

On condition that the logical value "1" is set on a multiplexer enable (MPXE) signal storage area 302 of each of the virtual channel register SVCR2, SVCR3, SVCR5, SVCR6, and SVCR7, the capture of an analog signal from the analog port AN0 corresponding to the external multiplexer 12 is enabled. Further, a select channel of the external multiplexer 12 is set on the multiplexer (MPX) channel information storage area 303 of each of the virtual channel registers SVCR2, SVCR3, SVCR5, SVCR6, and SVCR7.

In this embodiment, the setting is made on the virtual channel register SVCR2 to select the second channel of the external multiplexer 12. On the virtual channel register SVCR3, the setting is made to select the first channel of the external multiplexer 12. In the same way, the setting to select the fourth channel of the external multiplexer 12 is made on the virtual channel register SVCR5, and the setting to select the third channel of the external multiplexer 12 is made on the virtual channel register SVCR7. The weight information of each virtual channel is set in the weight information storage area 304 of each of the virtual channel registers SVCR2, SVCR3, SVCR5, SVCR6, SVCR7 to stabilize the A/D converting action. In this embodiment, the weight "1 μs" is set for the virtual channel registers SVCR2, SVCR3, and SVCR5, the weight "2 μs" is set for the virtual channel register SVCR6, and the weight "6 μs" is set for the virtual channel register SVCR7. In addition, SGVCSP0=0 is set as the SG start pointer, and SGVCEP0=7 is set as the SG end pointer.

Consequently, the scan group SG0 is formed. Further, SGM-CYCR0=4 is set as the number of repetition of A/D conversion for the scan group SG0.

Figure 6:
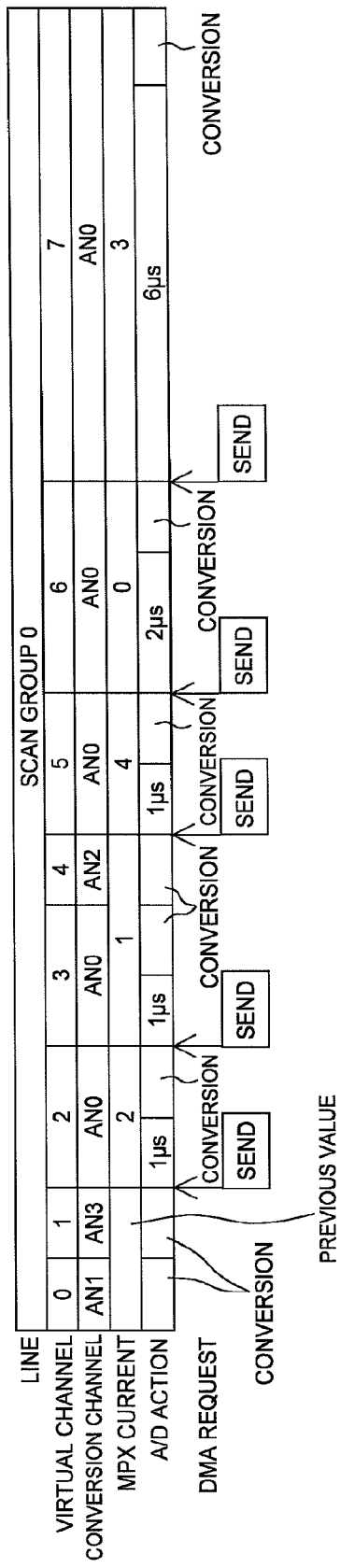
FIG. 6 is a diagram for explaining actions of the primary parts in the case where the setting as shown in FIG. 5 is made.

FIG. 6 shows the way each primary part works on condition that the settings as shown in FIG. 5 are made.

Under the control of control circuit 127, the A/D conversion is performed on the scan group 0 in virtual channels' ascending order (0, 1, 2, 3, 4, 5, 6, 7, . . . ). The control circuit 127 performs the control for sending a piece of multiplexer (MPX) channel information to the external multiplexer 12 before executing A/D conversion on the virtual channel corresponding to the virtual channel register with the multiplexer enable (MPXE) signal set to the logical value "1". For instance, in execution of the A/D conversion involved with the virtual channel 2 corresponding to the virtual channel register SVCR2, the control circuit 127 first copies the multiplexer (MPX) channel information "2" to the MPX current register 204, and then sends a transfer request to the DMAC 122. On receipt of a transfer request from the control circuit 127, the DMAC 122 acquires a bus right of the peripheral bus 123, and transfers the multiplexer (MPX) channel information "2" in the MPX current register 204 to the 10 register 119. After the completion of the transfer, the multiplexer (MPX) channel information "2" in the 10 register 119 is transmitted to the external multiplexer 12 through the digital port 111. Thus, an input signal of the second channel is selected by the external multiplexer 12, and it is taken in by the microcontrol unit 11 through the analog port AN0. At this time, the built-in multiplexer 117 selects an analog signal input through the analog port AN0, and the signal is conveyed to the A/D conversion part 118, and experiences A/D conversion. The start timing of the A/D converting action in this case is delayed by a time corresponding to a given weight from the time when a transfer request is sent to the DMAC 122. In this embodiment, the weight information concerning the virtual channel 2 is set to "1 μs", and therefore the start timing of the A/D converting action is delayed by "1 μs" from the time when the transfer request is sent to the DMAC 122. The weight time of the weight information of each virtual channel is set taking into account a length of time from when the transfer request is sent to the DMAC 122 until when a channel select condition in the external multiplexer 12 becomes stable, during which the DMAC 122 transfers the multiplexer (MPX) channel information in the MPX current register 204 to the IO register 119; the weight time of the weight information of each virtual channel is made a little longer than that time. The weight setting like this allows the A/D conversion part 118 to perform A/D conversion of an analog signal taken in through the external multiplexer 12 with the analog signal kept stable. The weight setting like this can be performed on the virtual channels corresponding to the virtual channel registers SVCR3, SVCR5, SVCR6, and SVCR7 in the same way as in the case described above.

Figure 8:
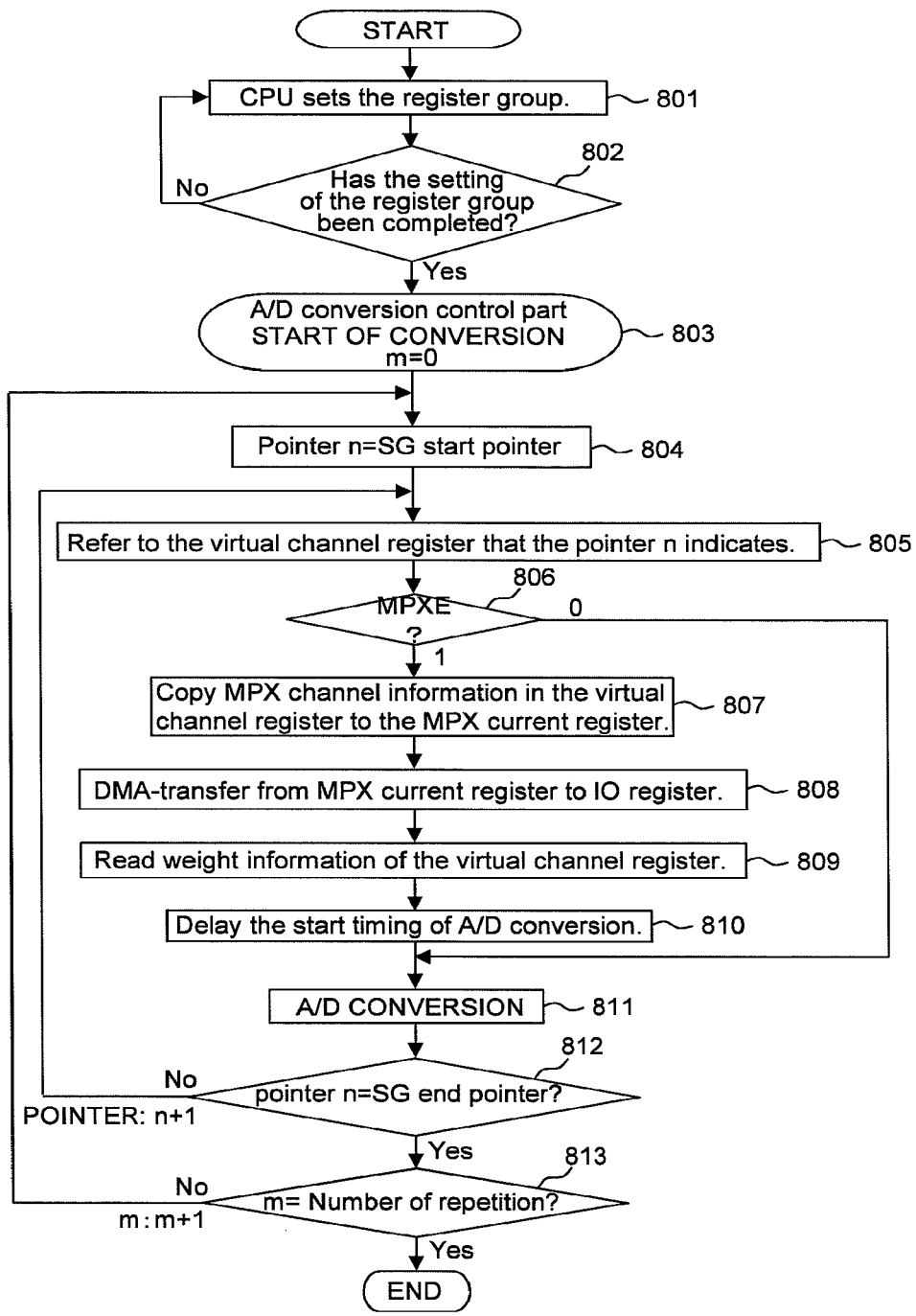
FIG. 8 is a flow chart showing major actions in the data processing system shown in FIG. 1.

Next, the major actions of the data processing system 10 will be described with reference to the flow chart of FIG. 8.

First, the CPU 120 makes the settings on the register group 126 (801). Specifically, the settings of the virtual channel register group 201, the A/D conversion control register 203, the MPX current register 204, the MPX optional wait register 205, and the scan-group-forming register 206 are performed by the CPU 120.

In this embodiment, the number of virtual channels is 48 and therefore, 48 virtual channel registers SVCR0, SVCR1, SVCR2, . . . , SVCR47 are formed in the virtual channel register group 201; the CPU 120 makes the settings, in turn, on information storage areas in the virtual channel registers.

For instance, the virtual channel register SVCR0 includes the conversion channel information storage area 301, the multiplexer enable (MPXE) signal storage area 302, the multiplexer (MPX) channel information storage area 303, the weight information storage area 304, as shown in FIG. 3. The correspondences between the virtual channels and the analog ports are set in the conversion channel information storage area 301. The enable signal showing the effectiveness of each virtual channel is set in the multiplexer enable (MPXE) signal storage area 302. The information for designating a select channel in the select circuit is set in the multiplexer (MPX) channel information storage area 303. The weight information for delaying the start timing of the A/D conversion process by each virtual channel is set in the weight information storage area 304.

The control information concerning the start and end of the A/D converting action in the A/D conversion part 118 is stored in the A/D conversion control register 203. The MPX current register 204 holds a piece of select information showing a current analog signal select state in the external multiplexer 12. The MPX optional wait register 205 is arranged so that a user of the microcontrol unit 11 can write appropriate weight information therein. The weight information set on the MPX optional wait register 205 is set in the weight information storage area 304 in the virtual channel register group 201.

The scan-group-forming register 206 includes the scan-group-forming registers SG0, SG1, . . . , SGn which correspond to a plurality of scan groups. For instance, the scan-group-forming register SG0 includes the SG control register 2061, the SG trigger-select register 2062, the SG status register 2063, the SG start pointer register 2064, the SG end pointer register 2065, and the SG multicycle register 2066. The priority information of each scan group is set on the SG control register 2061. On the SG trigger-select register 2062, SG trigger select information for specifying the start timing of the A/D conversion process for each scan group is set. The examples of the SG trigger include a start trigger formed by a timer, a start trigger formed by program execution by the CPU 120, and a start trigger formed by a signal (STT) taken in through the start-trigger-external-input port EXP. Which of them to make effective depends on the setting of the SG trigger-select register 2062. Specifically, an appropriate trigger is made effective for the scan group concerned according to the SG trigger select information set on the SG trigger-select register 2062. In the SG status register 2063, apiece of information showing a current status of each scan group is stored. The A/D conversion start point (start virtual channel) information for each scan group is set on the SG start pointer register 2064. The SG end pointer register 2065 stores apiece of endpoint (end virtual channel) information of A/D conversion for each scan group. The number of repetition of A/D conversion is set on the SG multicycle register 2066 for each scan group. In other words, in the case of successively performing A/D conversion on the virtual channels, including a virtual channel corresponding to an A/D conversion start point to a virtual channel corresponding to an A/D conversion end point, the number of repetition of the A/D conversion is set on the SG multicycle register 2066 for each scan group.

The other scan-group-forming registers SG1, . . . , SGn are set in the same way as the scan-group-forming register SG0 is set.

The CPU 120 makes a judgment on whether the setting of the register group 126 has been completed or not (802). In case that it is judged in this judgment that the setting of the register group 126 has been completed (Yes), the CPU 120 directs the A/D conversion control part 125 to start the A/D conversion. In response to this, in the control circuit 127 in the A/D conversion control part 125, the variable "m" for managing the number of repetition of A/D conversion by each scan group is initialized into "0", and the A/D conversion control is started (803). In the A/D conversion control, the value of the pointer n is set to be equal to the value of the SG start pointer register 2064, first (804).

Then, in the A/D conversion control, the control circuit 127 refers to a value of the virtual channel register corresponding to the pointer n (805), and makes a judgment on the logical value of an MPXE signal stored in the multiplexer enable (MPXE) signal storage area 302 in the virtual channel register concerned (806). With the MPXE signal set to the logical value "1", it is made effective to take in an analog signal through the analog port AN0 corresponding to the external multiplexer 12. Therefore, if the MPXE signal is judged as having the logical value "1" in the judgment in the step 806, the control circuit 127 copies, to the MPX current register 204, MPX channel information in the MPX channel information storage area 303 in the virtual channel register concerned (807). Then, the control circuit 127 makes a request for transfer to the DMAC 122. On receipt of the transfer request from the control circuit 127, the DMAC 122 acquires the bus right of the peripheral bus 123, and transfers the multiplexer (MPX) channel information in the MPX current register 204 to the IO register 119 (808). After the completion of the transfer, the multiplexer (MPX) channel information in the IO register 119 is conveyed to the external multiplexer 12 through the digital port 111. Then, an input signal of the second channel is selected in the external multiplexer 12, the signal is passed through the analog port AN0, and the built-in multiplexer 117, and transmitted to the A/D conversion part 118.

The control circuit 127 reads weight information in the weight information storage area 304 of the virtual channel register (809), and delays the A/D conversion start timing in the A/D conversion part 118 (810). Since the weight control like this is performed, the A/D conversion process is started on the virtual channel concerned after an elapse of a given time depending on the weight information (811). The weight time of the weight information of each virtual channel is set taking into account a length of time from when the transfer request is sent to the DMAC 122 until when a channel select condition in the external multiplexer 12 becomes stable, during which the DMAC 122 transfers the multiplexer (MPX) channel information in the MPX current register 204 to the IO register 119; the weight time of the weight information of each virtual channel is made a little longer than that time. Therefore, the A/D conversion part 118 is allowed to perform the A/D conversion of an analog signal concerned in a condition that the analog signal taken in through the external multiplexer 12 is stable. The result of the A/D conversion in the A/D conversion part 118 is stored in the data register group 202, and used by the CPU 120 in computing.

Incidentally, if the MPXE signal is judged to have the logical value "0" in the judgment of the step 806, it is made noneffective to take an analog signal in through the analog port AN0 corresponding to the external multiplexer 12 and as such, the control circuit 127 does not executes the processes of the steps 807-810. In this case, analog signals are taken in through the other analog ports AN1-AN3, on which the A/D conversion is performed (811).

Then, the control circuit 127 makes a judgment on whether the value of the pointer n is equal to that of the SG end pointer or not (812). In other words, a judgment is made on whether the value of the pointer n agrees with the endpoint (end virtual channel) information of A/D conversion for each scan group. In case that the value of the pointer n is judged as being different from the value of the SG end pointer (No) in the judgment of the step 812, which means that the end position of the scan group is not reached, the control circuit 127 updates the pointer n into "n+1", and then returns to the step 805. Then, the value of the virtual channel register corresponding to the pointer n after the update is referred to, and the steps above described are repeated. In case that the value of the pointer n is judged as being equal to the value of the SG end pointer (Yes) in the judgment of the step 812, which means that the end position of the scan group is reached, the control circuit 127 makes a judgment on whether or not the variable "m" is equal to the number of repetition of A/D conversion of each scan group in the SG multicycle register 2066 (813). In case that in the judgment, the variable "m" is judged as being different from the number of repetition of A/D conversion of each scan group in the SG multicycle register 2066 (No), which means that a predetermined number of repetition (m) is not reached, the control circuit 127 updates the variable "m" into "m+1", and then returns to the step 804. In this way, the A/D conversion process is repeated by the predetermined number (m) of repetition. In case that the variable "m" is judged as being equal to the number of repetition of A/D conversion of each scan group in the SG multicycle register 2066 (Yes), the control circuit 127 terminates the A/D conversion in the A/D conversion control part 125.

The following advantages and effects can be obtained according to the first embodiment.

(1) Conversion channels on which execution of the A/D conversion is desired, i.e. analog ports are set on the virtual channel registers SVCR0, SVCR1, SVCR2, . . . , SVCR47. Making the setting like this, the built-in multiplexer 117 selects a corresponding conversion channel (analog port) for each virtual channel, which is subjected to the A/D conversion in the A/D conversion part 118. The SG start pointer is set on the SG start pointer register 2064 for each scan group, and the SG end pointer is set on the SG end pointer register 2065 for each scan group. The arrangement like this allows the A/D conversion part 118 to successively execute A/D conversion process on virtual channels, from a virtual channel associated with the start pointer to a virtual channel associated with the end pointer. The correspondence between the virtual channels and the analog ports can be set appropriately. Therefore, according to the setting as described above, the A/D conversion can be performed on analog signals taken in through the analog ports in an arbitrary order.

(2) A plurality of scan groups are set, whereby the A/D conversion process can be executed on the scan groups. The scan groups can be set to overlap with each other. Further, on condition that A/D conversion process is performed on a plurality of scan groups, with priority information of each scan group set on the SG control register 2061, the A/D conversion process is performed according to the set priorities and therefore, the A/D conversion process can be performed according to the priorities efficiently.

(3) In the case of using the external multiplexer 12, weight information is set for each virtual channel as shown in FIG. 5, for example. The weight time of the weight information of each virtual channel is set taking into account a length of time from when the transfer request is sent to the DMAC 122 until when a channel select condition in the external multiplexer 12 becomes stable, during which the DMAC 122 transfers the multiplexer (MPX) channel information in the MPX current register 204 to the IO register 119; the weight time of the weight information of each virtual channel is made a little longer than that time. Since the weight setting like this is performed, the A/D conversion part 118 is allowed to perform the A/D conversion of an analog signal concerned in a condition that the analog signal taken in through the external multiplexer 12 is stable.

Second Embodiment

Figure 9:
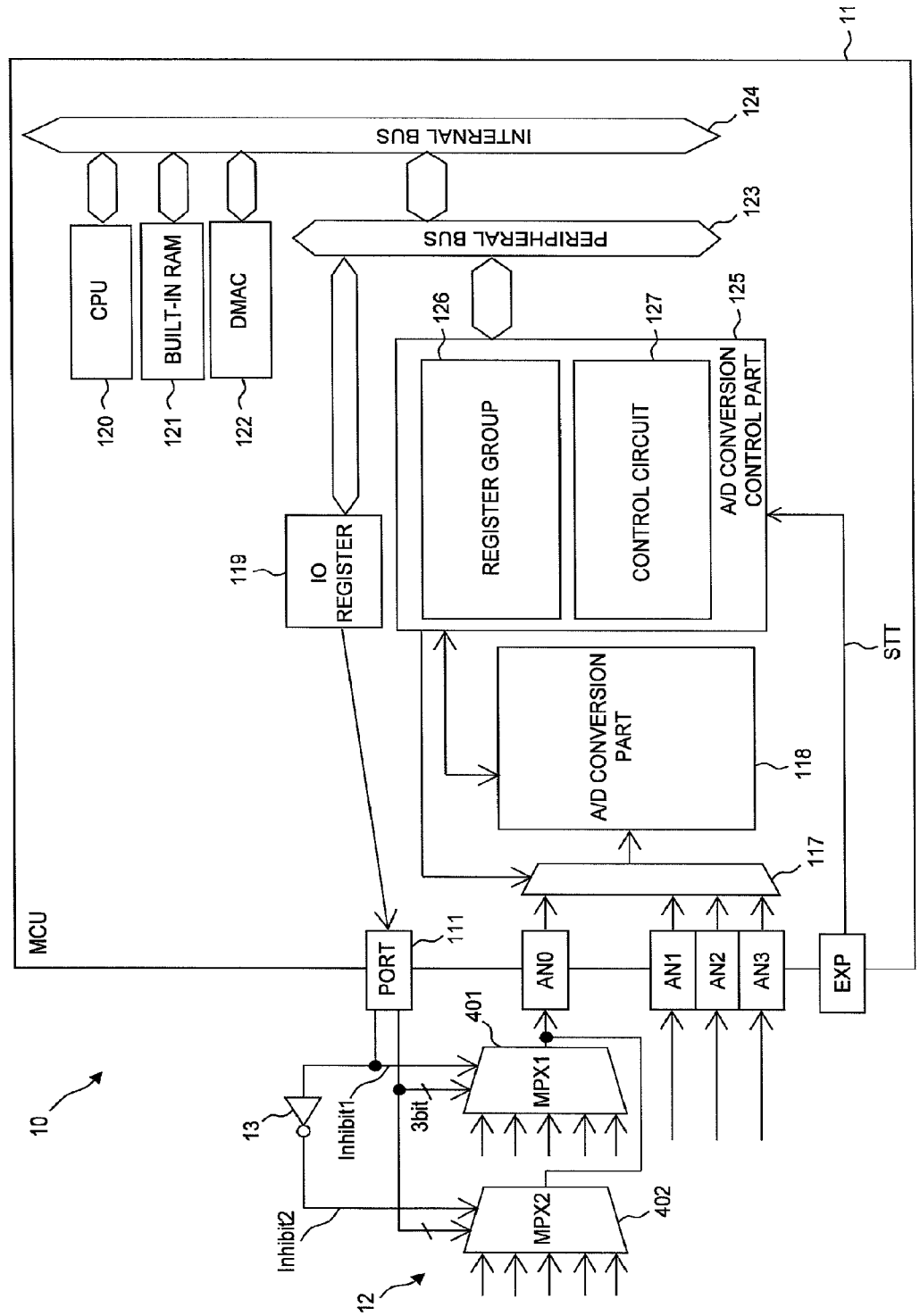
FIG. 9 is a block diagram showing an example of the structure of the data processing system.

FIG. 9 shows an example of the structure of the data processing system.

The data processing system 10 shown in FIG. 9 is remarkably different from the data processing system shown in FIG. 1 in the point that the external multiplexer 12 includes a first multiplexer (MPX1) 401 and a second multiplexer (MPX2) 402.

The first and second multiplexers 401 and 402 are each arranged to be able to select analog signals. The output terminal of the first multiplexer 401, and the output terminal of the second multiplexer 402 are commonly connected with the analog port AN0 corresponding to the multiplexer 12. With the connection like this, in case that the first and second multiplexers 401 and 402 work concurrently, an output of the first multiplexer 401, and an output of the second multiplexer 402 interfere with each other, and therefore the first and second multiplexers 401 and 402 must be arranged to work exclusively. Hence, in the structure shown in FIG. 9, the output of the first multiplexer 401, and the output of the second multiplexer 402 are exclusively controlled to become a high impedance by a first inhibit signal Inhibit1 and a second inhibit signal Inhibit2. The first inhibit signal Inhibit1 makes up the most significant bit of four bits of multiplexer (MPX) channel information output through the digital port 111. In addition, the first inhibit signal Inhibit1 is inverted in logic by an inverter 13, thereby forming the second inhibit signal Inhibit2.

In the case that the first inhibit signal Inhibit1 is asserted into a high level, for example, the output of the first multiplexer 401 is fixed to a high impedance. At this time, the second inhibit signal Inhibit2 is negated into a low level and therefore, the second multiplexer 402 is allowed to select analog signals based on low-order three bits of 4 four bits of multiplexer (MPX) channel information output through the digital port 111. Since the output of the first multiplexer 401 is fixed to a high impedance, the output of the second multiplexer 402 is not affected by the output of the first multiplexer 401.

In case that the second inhibit signal Inhibit2 is asserted into e.g. a high level, the output of the second multiplexer 402 is fixed to a high impedance. At this time, the first inhibit signal Inhibit1 is negated into a low level and therefore, the first multiplexer 401 is allowed to select analog signals based on the lower three bits of four bits of multiplexer (MPX) channel information output through the digital port 111. Since the output of the second multiplexer 402 is fixed to a high impedance, the output of the first multiplexer 401 is not affected by the output of the second multiplexer 402.

Using the most significant bit of four bits of multiplexer (MPX) channel information output through the digital port 111 to control the first and second multiplexers 401 and 402 to work exclusively in this way, it becomes possible to avoid that the output of the first multiplexer 401 and the output of the second multiplexer 402 interfere with each other.

Further, the output terminal of the first multiplexer 401, and the output terminal of the second multiplexer 402 are connected, in common, to the analog port AN0, corresponding to the multiplexer 12 and therefore, one analog port AN0 can be shared by the first and second multiplexers 401 and 402. In this respect, the number of analog ports can be reduced in comparison to the case of coupling the first and second multiplexers 401 and 402 with analog ports for the exclusive use respectively. The external multiplexer 12 constituted by a combination of small-scale general-purpose multiplexers rather than one large-scale multiplexer, can cut the manufacturing cost. In such case, the external multiplexer 12 may be formed by combination of the first and second multiplexers 401 and 402 as shown in FIG. 9.

While in the structure shown in FIG. 9, the external multiplexer 12 includes the first multiplexer (MPX1) 401 and the second multiplexer (MPX2) 402, the external multiplexer 12 may be arranged to have a set of tree or more multiplexers.

Third Embodiment

Figure 7:
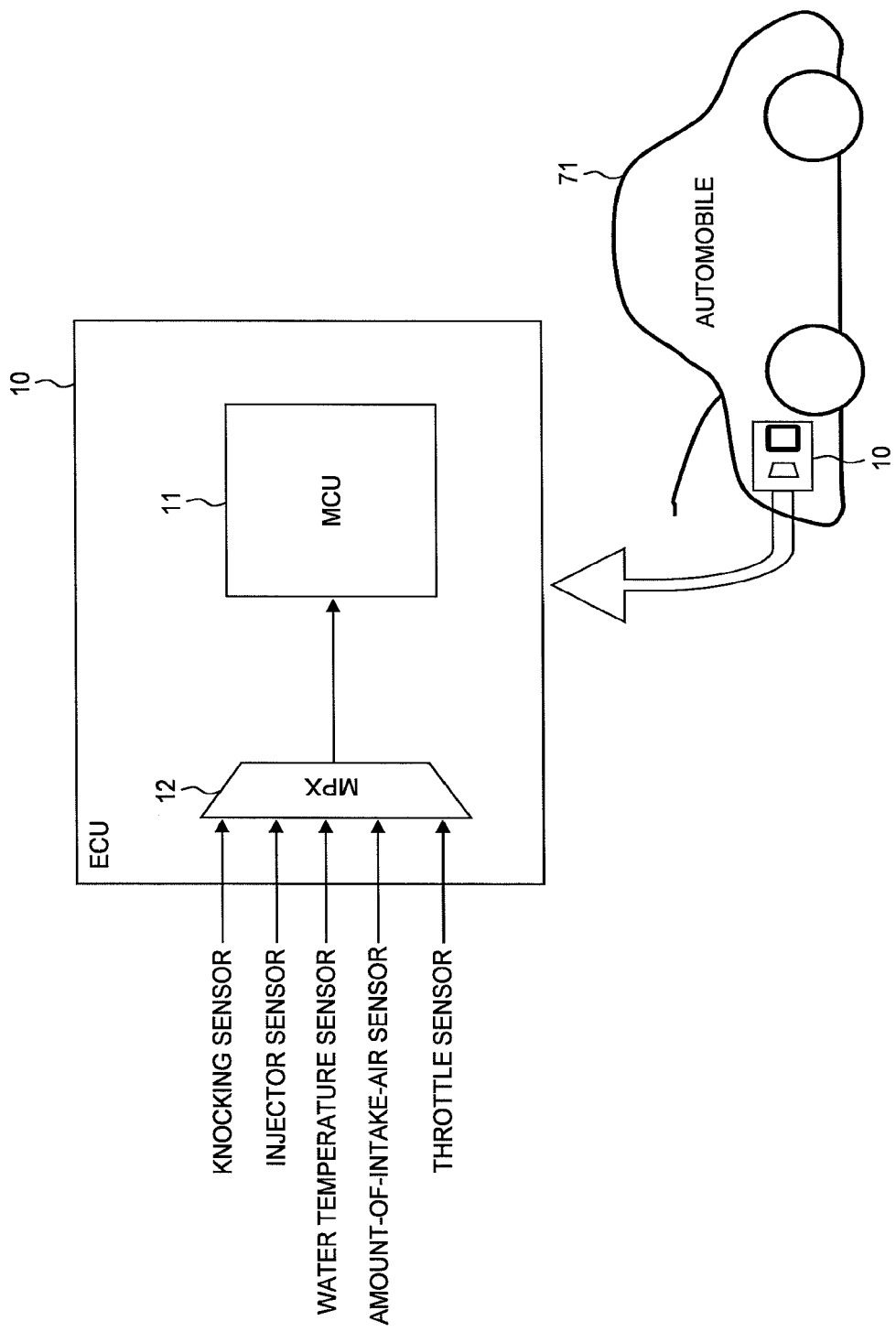
FIG. 7 is a diagram for explaining an example application of the data processing system shown in FIG. 1.

FIG. 7 shows an application example of the data processing system 10 shown in FIG. 1.

In this embodiment, the data processing system 10 is applied to an engine control unit (ECU). While electronically controlled auxiliary devices are used to perform the control involved in the operation of an engine incorporated in an automobile 71, the engine control unit has the function of comprehensively controlling them. Although no special restriction is intended, during such control, analog signals from various types of sensors including a knocking sensor, an injector sensor, a water-temperature sensor, an amount-of-intake-air sensor, and a throttle sensor are conveyed to the external multiplexer 12 which is externally attached to the microcontrol unit (MCU) 11, and selectively taken into the microcontrol unit 117. As described in the first embodiment, an appropriate weight setting is made for each corresponding multiplexer (MPX) channel and as such, analog signals taken in through the external multiplexer 12 are stable in the A/D conversion part 118, and in this condition the A/D conversion of the analog signal concerned can be performed. Thus, the engine can be controlled well.

While the invention made by the inventor has been described specifically based on the embodiments thereof, it is not limited to the embodiments. It is obvious that various changes and modifications may be made without departing from the subject matter thereof.

For instance, the microcontrol unit 11, and the data processing system 10 including the microcontrol unit can be applied to other devices other than an engine control unit (ECU).

The first embodiment is arranged so that the external multiplexer 12 is provided, and analog signals are selectively taken into the microcontrol unit 11 by the external multiplexer 12, and then subjected to A/D conversion. However, it is also possible that a plurality sets of digital data are taken into the microcontrol unit 11 through the external multiplexer, and then D/A conversion is performed on the digital data. In such case, it is sufficient to make an arrangement which includes: providing a D/A conversion control part having the same control function as the A/D conversion control part 125 has; and using the D/A conversion control part to control the external multiplexer and the D/A conversion part in operation.

What is claimed is:
1. A data processing system, comprising:
at least first and second analog ports;
at least first, second, and third virtual channels;
a first register that stores correspondence information between the analog ports and the virtual channels;
a second register that stores pointer information to select one of the virtual channels;

a selector that selects one of the analog ports based on the correspondence information and the pointer information; and an A/D converter that converts a value of the selected analog port to a digital value, wherein the correspondence information includes first information between the first analog port and the first virtual channel, second information between the first analog port and the second virtual channel and third information between the second analog port and the third virtual channel, wherein when the pointer information indicates the first information, the A/D converter converts a value of the first virtual channel through the first analog port, wherein when the pointer information indicates the second information, the A/D converter converts a value of the second virtual channel through the first analog port, and wherein when the pointer information indicates the third information, the A/D converter converts a value of the third virtual channel through the second analog port.

2. The data processing system according to claim 1, wherein one of the analog ports is assignable to two different virtual channels.

3. The data processing system according to claim 1, wherein the second register stores a start pointer and an end pointer as the pointer information, and wherein the selector selects, successively and in order, each virtual channel from a virtual channel associated with the start pointer to a virtual channel associated with the end pointer, and selects each analog port corresponding to each selected virtual channel.

4. The data processing system according to claim 3, wherein the second register further stores a repetition number, wherein a group consists of the selected analog ports, and wherein the selector selects the group the repetition number of times.

5. The data processing system according to claim 1, wherein the first register further stores delay information for each of the virtual channels, and wherein the conversion by the A/D converter is delayed, after one of the analog ports is selected, based on the delay information of the virtual channel corresponding to the selected analog port.

6. The data processing system according to claim 1, wherein the first virtual channel is coupled to a first analog signal source, the second virtual channel is coupled to a second analog signal source and the third virtual channel is coupled to a third analog signal source.

7. A data processing system, comprising:

at least first, second, and third virtual channels;

a first selector having first and second analog ports, the first analog port coupled to the first virtual channel and the second analog port coupled to the second virtual channel; and a microcontroller unit (MCU) having third and fourth analog ports, the first selector being coupled to the third analog port, the MCU including:

a first register that stores correspondence information between the analog ports and the virtual channels;

a second register that stores pointer information to select one of the virtual channels; and an A/D converter, wherein the MCU selects one of the third and fourth analog ports based on the correspondence information and the pointer information and the A/D converter converts a value of the selected analog port to a digital value, wherein the correspondence information includes first information between the third analog port and the first virtual channel, second information between the third analog port and the second virtual channel and third information between the fourth analog port and the third virtual channel, wherein when the pointer information indicates the first information, the A/D converter converts a value of the first virtual channel through the first selector and the third analog port, wherein when the pointer information indicates the second information, the A/D converter converts a value of the second virtual channel through the first selector and the third analog port, and wherein when the pointer information indicates the third information, the A/D converter converts a value of the third virtual channel through the fourth a analog port without the first selector.

8. The data processing system according to claim 7, wherein the MCU further includes a second selector that selects one of the third and fourth analog ports, and wherein the MCU selects one of the first and second virtual channels by the first and second selectors and selects the third virtual channel by the second selector, based on the correspondence information and the pointer information.

9. The data processing system according to claim 8, wherein the MCU outputs a first selection signal to the first selector to select one of the first and second virtual channels and outputs a second selection signal to the second selector to select one of the analog ports.

10. The data processing system according to claim 9, wherein the MCU further includes an output port to output the first selection signal to the first selector.

11. The data processing system according to claim 7, wherein the second register stores a start pointer and an end pointer as the pointer information, and wherein the MCU selects by the first and second selectors, successively and in order, each virtual channel from a virtual channel associated with the start pointer to a virtual channel associated with the end pointer, and selects each analog port corresponding to each selected virtual channel.

12. The data processing system according to claim 11, wherein the second register further stores a repetition number, wherein a group consists of the selected virtual channels, and wherein the MCU selects the group the repetition number of times by the first and second selectors.

13. The data processing system according to claim 7, wherein the first register further stores delay information for each of the virtual channels, and wherein the conversion by the A/D converter is delayed, after one of the virtual channels is selected, based on the delay information of the selected virtual channel.

14. The data processing system according to claim 7, wherein the first virtual channel is coupled to a first analog signal source, the second virtual channel is coupled to a second analog signal source and the third virtual channel is coupled to a third analog signal source.

* * * * *